(12) United States Patent
Min et al.

(10) Patent No.: US 10,943,800 B2
(45) Date of Patent: Mar. 9, 2021

(54) SEMICONDUCTOR PACKAGE DEVICE AND METHOD OF FORMING PACKAGE BODY

(71) Applicant: Advanced Semiconductor Engineering, Inc., Kaohsiung (TW)

(72) Inventors: Fan-Yu Min, Kaohsiung (TW); Chao-Hung Weng, Kaohsiung (TW); Liang-Chun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 288 days.

(21) Appl. No.: 15/490,817

(22) Filed: Apr. 18, 2017

(65) Prior Publication Data
US 2018/0301361 A1 Oct. 18, 2018

(51) Int. Cl.
*H01L 21/67* (2006.01)
*H01L 21/56* (2006.01)

(52) U.S. Cl.
CPC ...... *H01L 21/67126* (2013.01); *H01L 21/565* (2013.01); *H01L 21/566* (2013.01)

(58) Field of Classification Search
CPC ............. H01L 21/67126; H01L 21/565; H01L 21/566
See application file for complete search history.

(56) References Cited

U.S. PATENT DOCUMENTS

| 6,309,916 | B1 | 10/2001 | Crowley et al. | |
| 6,713,882 | B2* | 3/2004 | Yasuda | H01L 21/565 249/155 |
| 2004/0166605 | A1* | 8/2004 | Kuratomi | H01L 23/3128 438/106 |
| 2014/0077345 | A1* | 3/2014 | Uno | H01L 23/66 257/664 |

* cited by examiner

*Primary Examiner* — Joseph S Del Sole
*Assistant Examiner* — Melody Tsui
(74) *Attorney, Agent, or Firm* — Foley & Lardner LLP

(57) ABSTRACT

An apparatus for packaging a semiconductor device is provided. The apparatus includes a first mold, a second mold and a support element. The first mold includes a plate. The second mold includes a carrier disposed corresponding to the plate. The carrier defines a hole penetrating the carrier. The support element is engaged with the hole for supporting an object to be molded.

20 Claims, 13 Drawing Sheets

FIG. 1

SEMICONDUCTOR PACKAGE DEVICE AND METHOD OF FORMING PACKAGE BODY

BACKGROUND

1. Technical Field

The present disclosure relates to an apparatus and a method for packaging a semiconductor device.

2. Description of the Related Art

Mounting electronic components on both sides of a substrate can increase the utilization rate of the substrate, which reduces the total area of the substrate. In comparable double-side molding techniques, edges of a wafer to be molded are placed on a molding machine and then molding materials are applied to encapsulate the wafer. However, due to the large size and thin thickness of the wafer (e.g., a 12-inch wafer having a thickness less than 300 micrometers (μm)), wafer warpage may occur, which may cause problems during a molding process or may even damage the wafer.

SUMMARY

In some aspects according to some embodiments, an apparatus for packaging a semiconductor device includes a first mold, a second mold and a support element. The first mold includes a plate. The second mold includes a carrier disposed corresponding to the plate. The carrier defines a hole penetrating the carrier. The support element is engaged with the hole for supporting an object to be molded.

In some aspects according to some embodiments, an apparatus for packaging a semiconductor device includes a first mold, a second mold and a support element. The first mold includes a plate and a first frame surrounding the plate. The second mold includes a carrier and a second frame surrounding the carrier. The support element is disposed on the carrier and extends from a sidewall of the second frame to another sidewall of the second frame to divide the carrier into two regions.

In some aspects according to some embodiments, a method of molding an object includes: providing a molding apparatus including a top mold and a bottom mold, the bottom mold defining a cavity and including at least one support element on a bottom surface of the cavity; injecting a molding material into the cavity; placing the object on the support element; and closing the top mold and the bottom mold so that the molding material covers a top surface and a bottom surface of the object.

Figure 1:
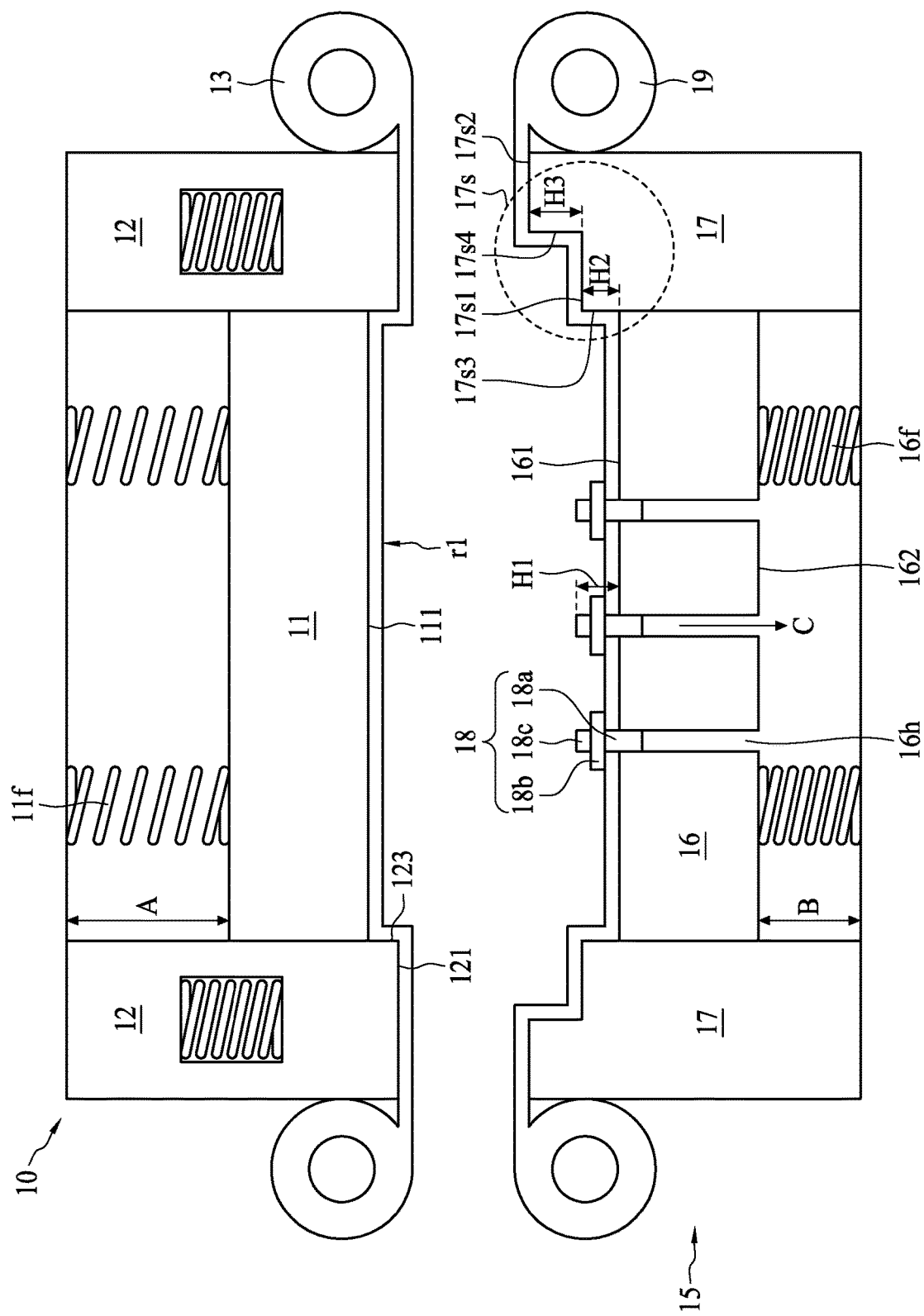
FIG. 1 illustrates a cross-sectional view of a packaging apparatus in accordance with some embodiments of the present disclosure.

Common reference numerals are used throughout the drawings and the detailed descriptions to indicate the same or similar components. The present disclosure can be best understood from the following detailed description taken in conjunction with the accompanying drawings.

DETAILED DESCRIPTION

FIG. 1 illustrates a cross-sectional view of a packaging apparatus 1 in accordance with some embodiments of the present disclosure. The packaging apparatus 1 includes an upper mold 10 and a bottom mold 15.

The upper mold 10 includes a plate 11 and a frame 12 surrounding the plate 11. The plate 11 is movable upward and downward relative to the frame 12. For example, the plate 11 is movable along a direction indicated by arrow A shown in FIG. 1. In some embodiments, the plate 11 may be connected to at least one elastic member 11f to control the movement of the plate 11. In some embodiments, surface 111 of the plate 11 and a sidewall 123 of the frame 12 define a space.

In some embodiments, a release film 13 is disposed on the surface 111 of the plate 11, the sidewall 123 of the frame 12 and a surface 121 of the frame 12. The release film 13 is beneficial for releasing the molding compound after the molding process.

The bottom mold 15 includes a plate (e.g., a carrier) 16 and a frame 17 surrounding the plate 16. The plate 16 is disposed at a location corresponding to or aligned with the plate 11 of the upper mold 10. For example, a surface 161 of the plate 16 faces the surface 111 of the plate 11. The plate 16 is movable upward and downward relative to the frame 17. For example, the plate 16 is movable along a direction indicated by arrow B shown in FIG. 1. As another example, the plate 16 can be moved toward the plate 11. In some embodiments, the plate 16 may be connected to at least one elastic member 16f to control the movement of the plate 16.

The plate 16 comprises at least one hole 16h penetrating the plate 16. The hole 16h is formed from the top surface 161 of the plate 16 to a bottom surface 162 of the plate 16. A support element 18 is engaged with the hole 16h for supporting an object to be molded. In some embodiments, the support element 18 includes three portions 18a, 18b and 18c. The portion 18a is disposed within the hole 16h. The portion 18b is over the surface 161 of the plate 16 and connected to the portion 18a. The portion 18c is on the portion 18b and connected to the portion 18b. An area of the portion 18b is greater than the area of the portion 18a or 18c from a top or bottom view. For example, the portion 18b is wider than the portion 18a or the portion 18c. In some embodiments, the hole 16h can be connected to a vacuum device to fasten the support element 18 by a suction force applied in a direction of arrow C. A diameter of the portion 18b is greater than a diameter of the hole 16h to prevent the support element 18 from falling into the hole 16h by the suction force. In addition, the portion 18b can prevent molding materials from falling or flowing into the hole 16h during the molding process.

As shown in FIG. 1, the frame 17 has a stepped structure 17s. The stepped structure 17s has a first surface 17s1 and a second surface 17s2. The first surface 17s1 is lower than the second surface 17s2. In some embodiments, a height H1 of the support element 18 exposed from the plate 16 is substantially the same as a distance H2 from the surface 161 of the plate 16 to the surface 17s1 of the stepped structure 17s. In some embodiments, a distance H3 from the surface 17s1 of the stepped structure 17s to the surface 17s2 of the stepped structure 17s is substantially the same as a thickness of an object to be molded.

In some embodiments, a release film 19 is disposed on the surface 161 of the plate 16, on sidewalls 17s3, 17s4 of the stepped structure 17s of the frame 17 and on the surfaces 17s1, 17s2 of the stepped structure 17s of the frame 17. The release film 19 is disposed between the portion 18b of the support element 18 and the surface 161 of the plate 16. The release film 19 is beneficial for releasing the molding compound after the molding process. The release film 19 is fastened to the surface 161 of the plate 16 by portion 18b of the support element 18 secured by the suction force provided by the vacuum device, which can mitigate (e.g., avoid) a problem of bleeding of the molding materials caused by wrinkling of the release film 19.

During the molding process, a molding material is injected into a space defined by the surface 161 of the plate 16, the sidewalls 17s3, 17s4 of the stepped structure 17s of the frame 17 and the surfaces 17s1, 17s2 of the stepped structure 17s of the frame 17. The molding materials may include an epoxy resin including fillers, a molding compound (e.g., an epoxy molding compound or other molding compound), a polyimide, a phenolic compound or material, a material including a silicone dispersed therein, or a combination thereof. An object (e.g., a wafer, a substrate, a carrier, etc., on which semiconductor devices or other components are mounted or attached) to be molded is placed on the support element 18 and the surface 17s1 of the stepped structure 17s of the frame 17. Then, the upper mold 10 and the bottom mold 15 are moved to be close to each other.

In comparable double-side molding techniques, edges of a wafer to be molded are placed on a molding machine; however, due to the large size and thin thickness of the wafer (e.g., a 12-inch wafer having a thickness less than 300 micrometers (μm)), wafer warpage may occur, which may cause problems during the molding process or even damage the wafer. In accordance with some embodiments, since an object to be molded is placed on both the support element 18 and the surface 17s1 of the stepped structure 17s of the frame 17, edges of the object can be supported by the surface 17s1 of the stepped structure of the frame and the middle portion of the object can be supported by the support element 18. Therefore, warpage or damage of the object to be molded can be mitigated or prevented.

Figure 2A:
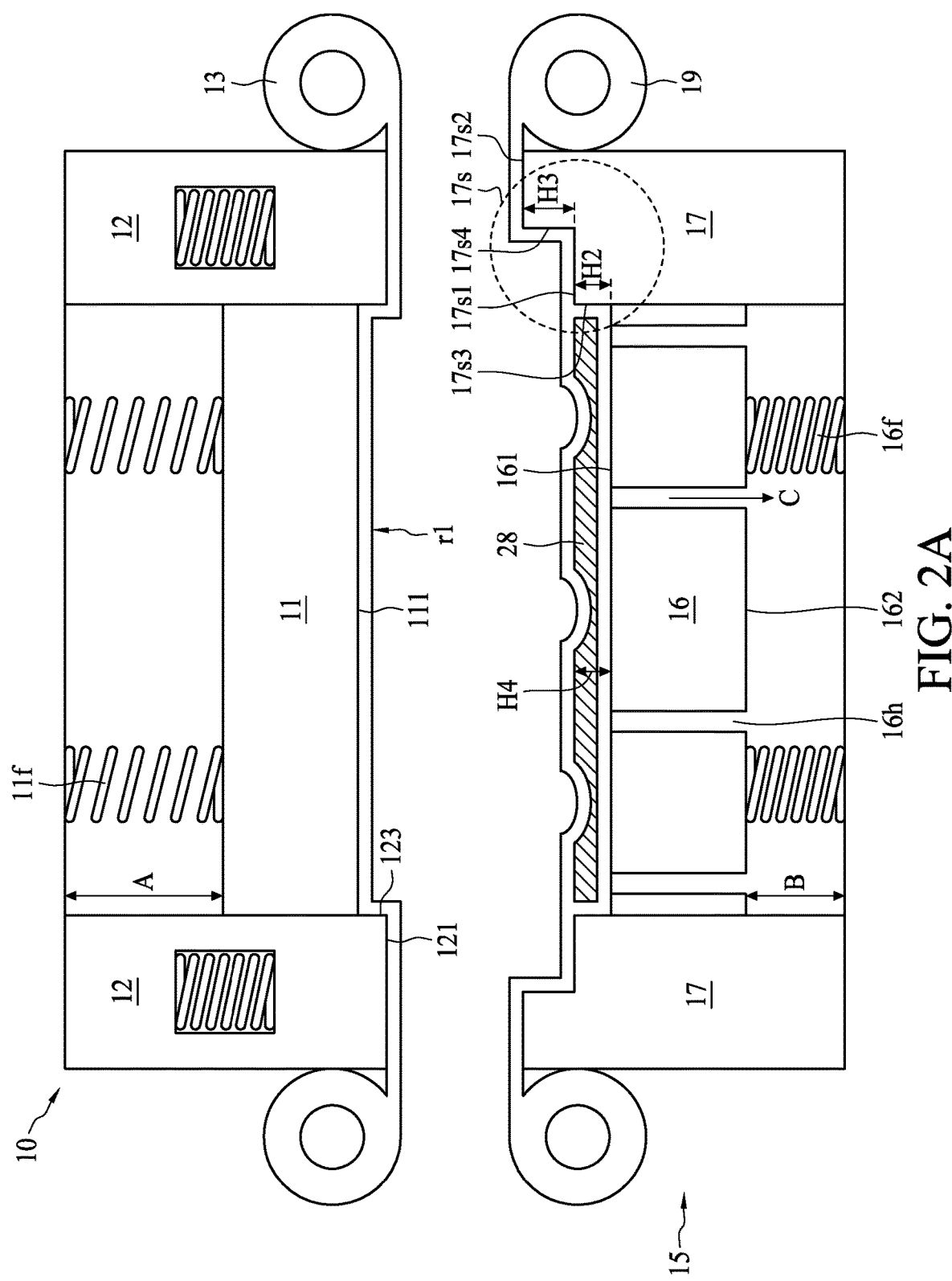
FIG. 2A illustrates a cross-sectional view of a packaging apparatus in accordance with some embodiments of the present disclosure.

FIG. 2A illustrates a cross-sectional view of a packaging apparatus 2 in accordance with some embodiments of the present disclosure. The packaging apparatus 2 is similar to the packaging apparatus 1 shown in FIG. 1 except that support element 28 of the packaging apparatus 2 is arranged across the frame 17 and that the release film 19 is disposed on the support element 28 and between the support element 28 and the plate 16.

Figure 2B:
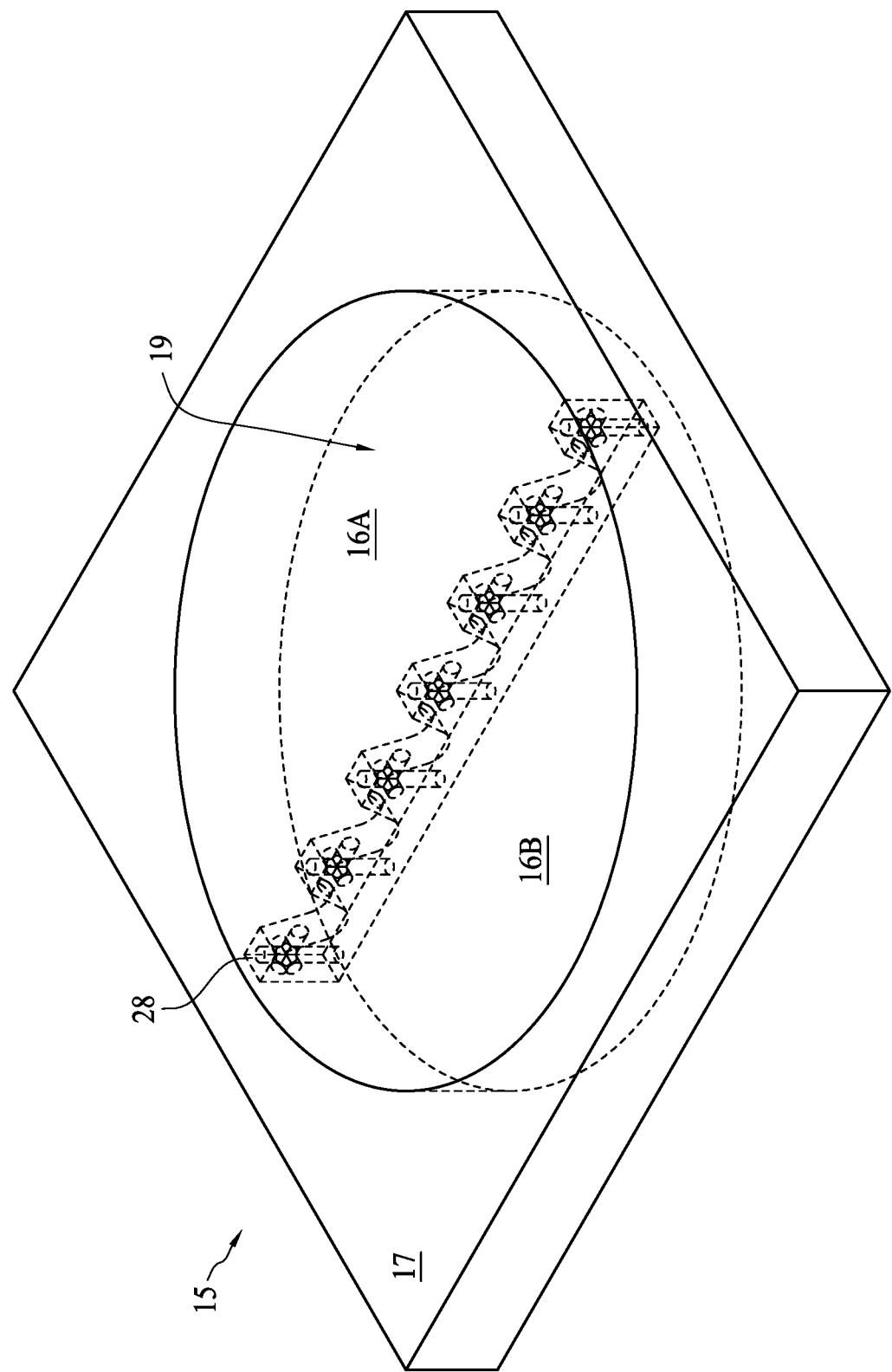
FIG. 2B illustrates a perspective view of a packaging apparatus in accordance with some embodiments of the present disclosure.

FIG. 2B illustrates a perspective view of the packaging apparatus 2 in accordance with some embodiments of the present disclosure. As shown in FIG. 2B, the support element 28 extends from a sidewall of the frame 17 to an opposite sidewall of the frame 17. The support element 28 divides the plate 16 into a first region 16A and a second region 16B. As shown in FIG. 2A, a height H4 of the support element 28 is substantially the same as a distance H2 from the surface 161 of the plate 16 to the surface 17s1 of the stepped structure 17s.

Figure 2C:
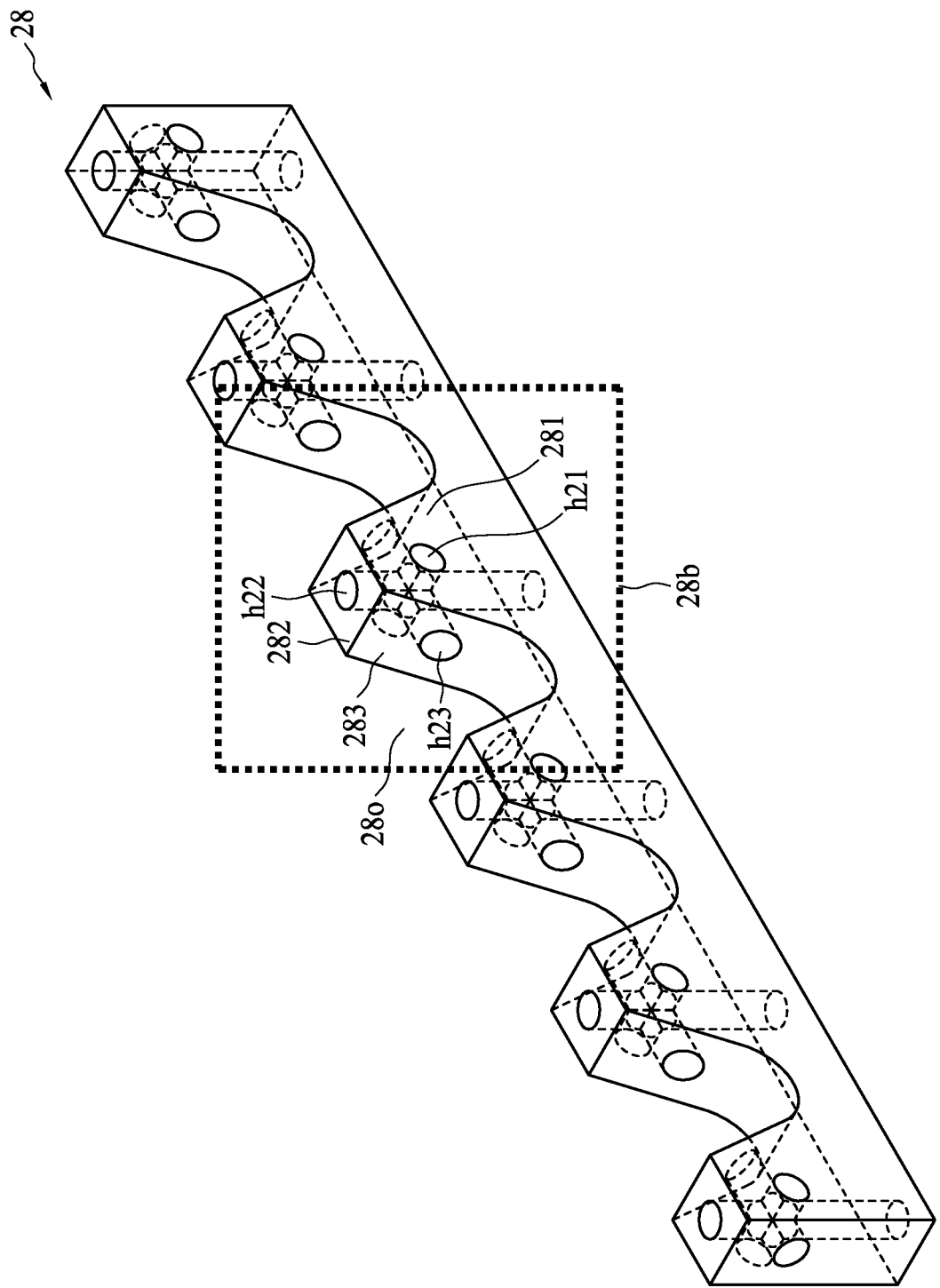
FIG. 2C illustrates a perspective view of a support element in accordance with some embodiments of the present disclosure.

FIG. 2C illustrates a detailed structure of the support element 28 in accordance with some embodiments of the present disclosure. The support element 28 includes a plurality of bulged structures 28b. The support element 28 includes a plurality of openings 28o between any two of the bulged structures 28b (e.g., adjacent bulged structures 28b) to allow molding materials to flow between the first region 16A of the plate 16 and the second region 16B of the plate 16. Hence, when the molding materials are injected into the plate 16, surfaces of the molding materials at the first region 16A are substantially coplanar with surfaces of the molding materials at the second region 16B.

In some embodiments, each bulged structure 28b defines a first hole h21 penetrating the bulged structure 28b from a lateral surface 281 to an opposite lateral surface, a second hole h22 penetrating the bulged structure 28b from a top surface 282 to an opposite bottom surface, and a third hole h23 penetrating the bulged structure 28b from a lateral surface 283 corresponding to the opening 28o to an opposite lateral surface. The first hole h21, the second hole h22 and the third hole h23 are interconnected to one another. The release film 19 is disposed on the support element 28 to cover the holes h21, h22 and h23. The hole h22 on the bottom surface opposite to the top surface 282 is connected to (or in communication or aligned with) the hole 16h of the plate 16 as shown in FIG. 2A, and the holes h22 and 16h are together connected to (or in communication or aligned with) a vacuum device to fasten or secure the release film 19 by a suction force.

In accordance with some embodiments, the object to be molded is placed on the support element 28 and the surface 17s1 of the stepped structure 17s of the frame 17, and thus the edges of the object can be supported by the surface 17s1 of the stepped structure 17s of the frame 17 and the middle portion of the object can be supported by the support element 28. Therefore, warpage or damage of the object to be molded can be mitigated or prevented.

Figure 3:
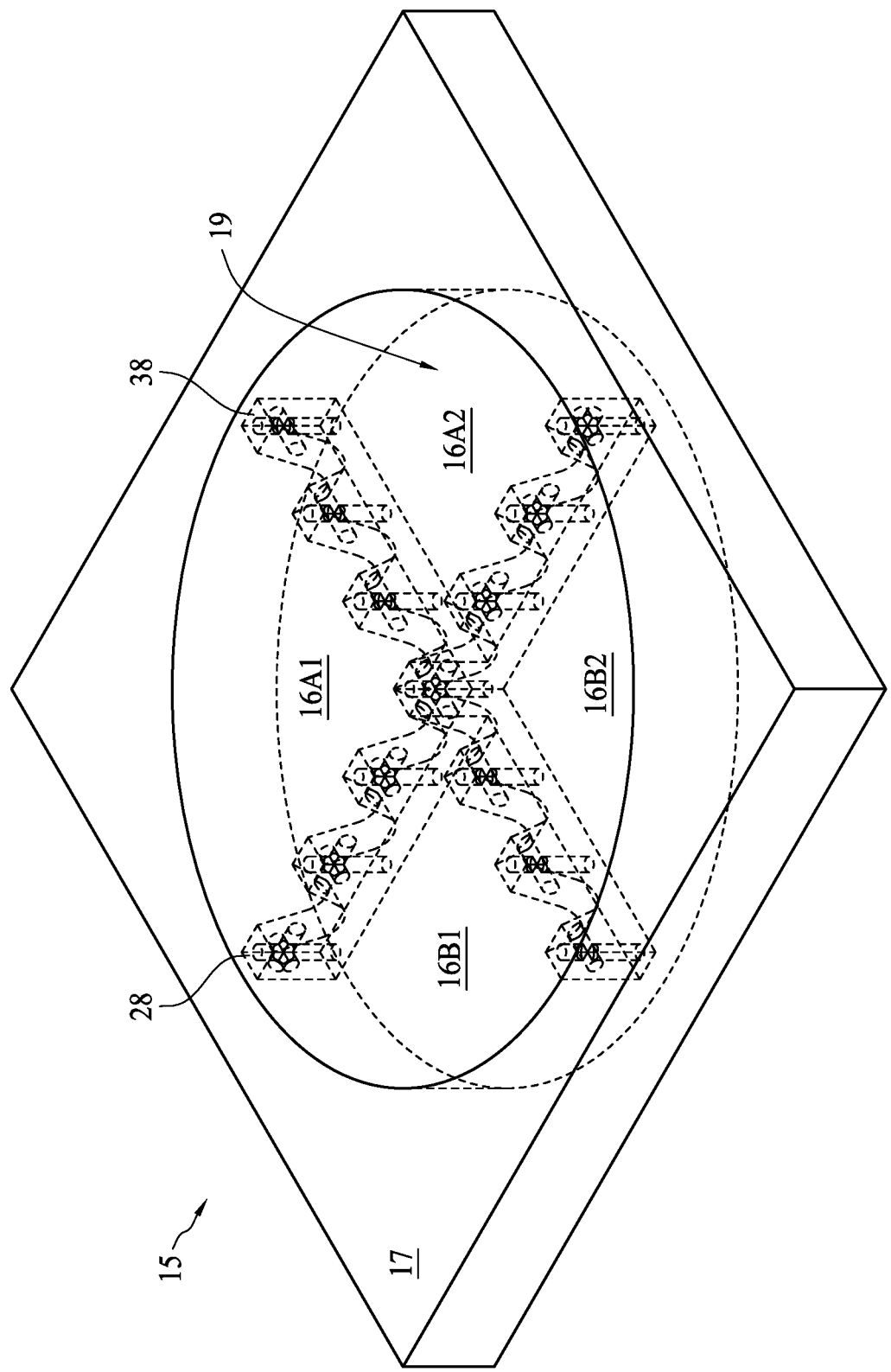
FIG. 3 illustrates a perspective view of a packaging apparatus in accordance with some embodiments of the present disclosure.

FIG. 3 illustrates a perspective view of a packaging apparatus 3 in accordance with some embodiments of the present disclosure. The packaging apparatus 3 is similar to the packaging apparatus 2 shown in FIGS. 2A-2B except that the packaging apparatus 3 further includes a support element 38.

The support element 38 is disposed on the plate 16 and across or crossing the support element 28. In some embodiments, the support element 38 is positioned to extend substantially perpendicularly to the support element 28. The support elements 28 and 38 divide the plate 16 into four regions 16A1, 16A2, 16B1 and 16B2. A height of the support element 38 is substantially the same as a height of the support element 28.

The structure of the support element 38 is similar to that of the support element 28. The support element 38 includes a plurality of bulged structures, any of two bulged structures (e.g., two adjacent bulged structures) are partially separated by an opening to allow molding materials to flow among the four regions 16A1, 16A2, 16B1 and 16B2 of the plate 16. Hence, when the molding materials are injected into the plate 16, surfaces of the molding materials at the four regions 16A1, 16A2, 16B1 and 16B2 are substantially coplanar. In some embodiments, the bulged structure of the support element 38 includes a hole on a bottom surface of the bulged structure that is connected to (or in communication or aligned with) a vacuum device to fasten or secure the release film disposed on the support element 38 by a suction force.

Since the packaging apparatus 3 includes an additional support element 38, the apparatus has improved capability to support an object to be molded thereon in comparison with the packaging apparatus 2 shown in FIGS. 2A-2B.

FIGS. 4A, 4B, 4C and 4D illustrate a method for double-side molding an object 40 in accordance with some embodiments of the present disclosure.

Figure 4A:
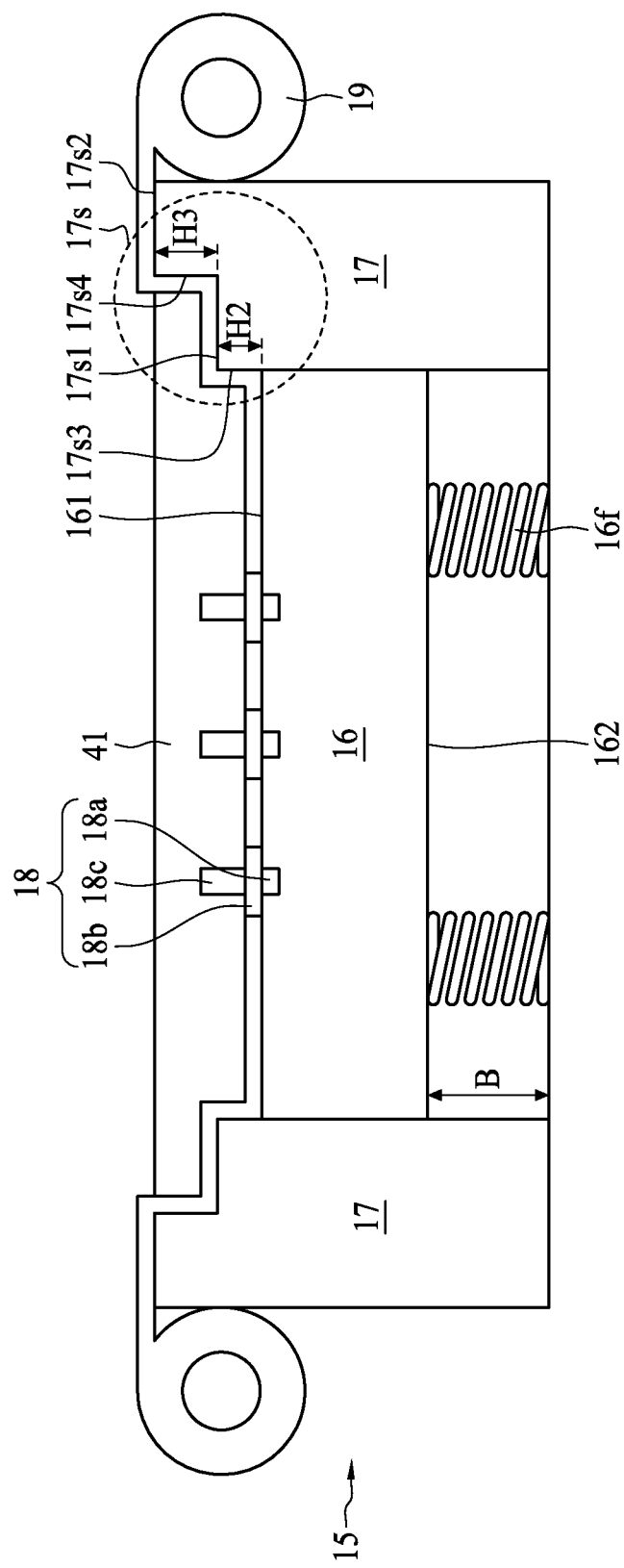
FIG. 4A, FIG. 4B, FIG. 4C and FIG. 4D illustrate a method for double-side molding in accordance with some embodiments of the present disclosure.

Referring to FIG. 4A, the package apparatus 1 shown in FIG. 1 is provided. In other embodiments, the package apparatus 1 can be replaced by the package apparatus 2 or 3 shown in FIGS. 2A and 3. A molding material 41 is injected into a space defined by the surface 161 of the plate 16, the sidewalls 17s3, 17s4 of the stepped structure 17s of the frame 17 and the surfaces 17s1, 17s2 of the stepped structure 17s of the frame 17. The molding material 41 may include an epoxy resin including fillers, a molding compound (e.g., an epoxy molding compound or other molding compound), a polyimide, a phenolic compound or material, a material including a silicone dispersed therein, or a combination thereof.

Figure 4B:
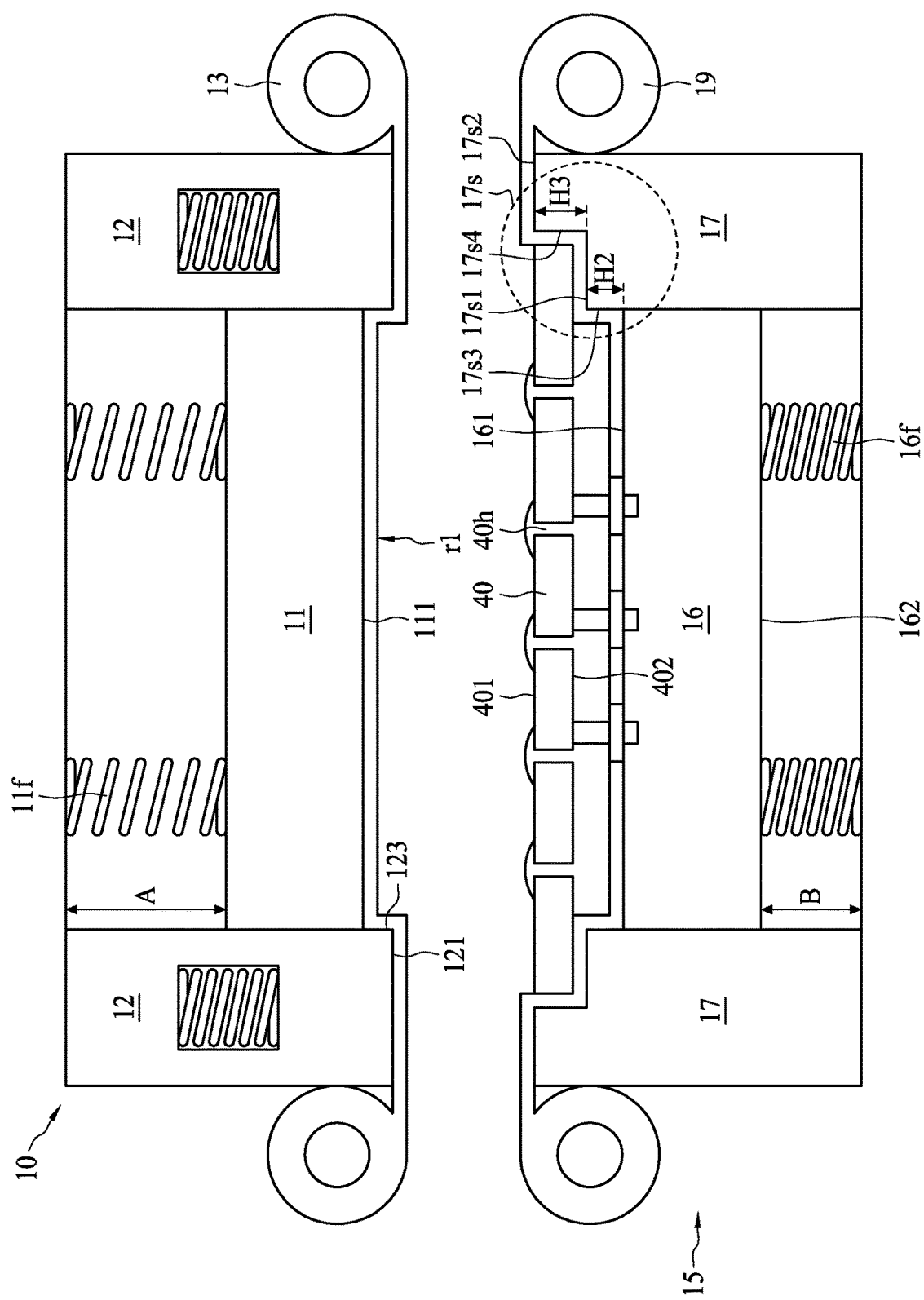

Referring to FIG. 4B, the object 40 to be molded is then placed on the support element 18 and the surface 17s1 of the stepped structure 17s of the frame 17. The object 40 defines at least one opening 40h penetrating the object 40. In some embodiments, the object 40 may be a wafer, a substrate, a carrier or other object to be molded. The openings 40h are formed at predetermined locations of the object 40 that do not include electronic components or traces.

After the object 40 is placed on the support element 18 and the surface 17s1 of the stepped structure 17s of the frame 17, the molding material 41 flows from a bottom surface 402 of the object 40 to the openings 40h. In some embodiments, the molding material 41 may further flow from the openings 40h to a top surface 401 of the object 40.

Figure 4C:
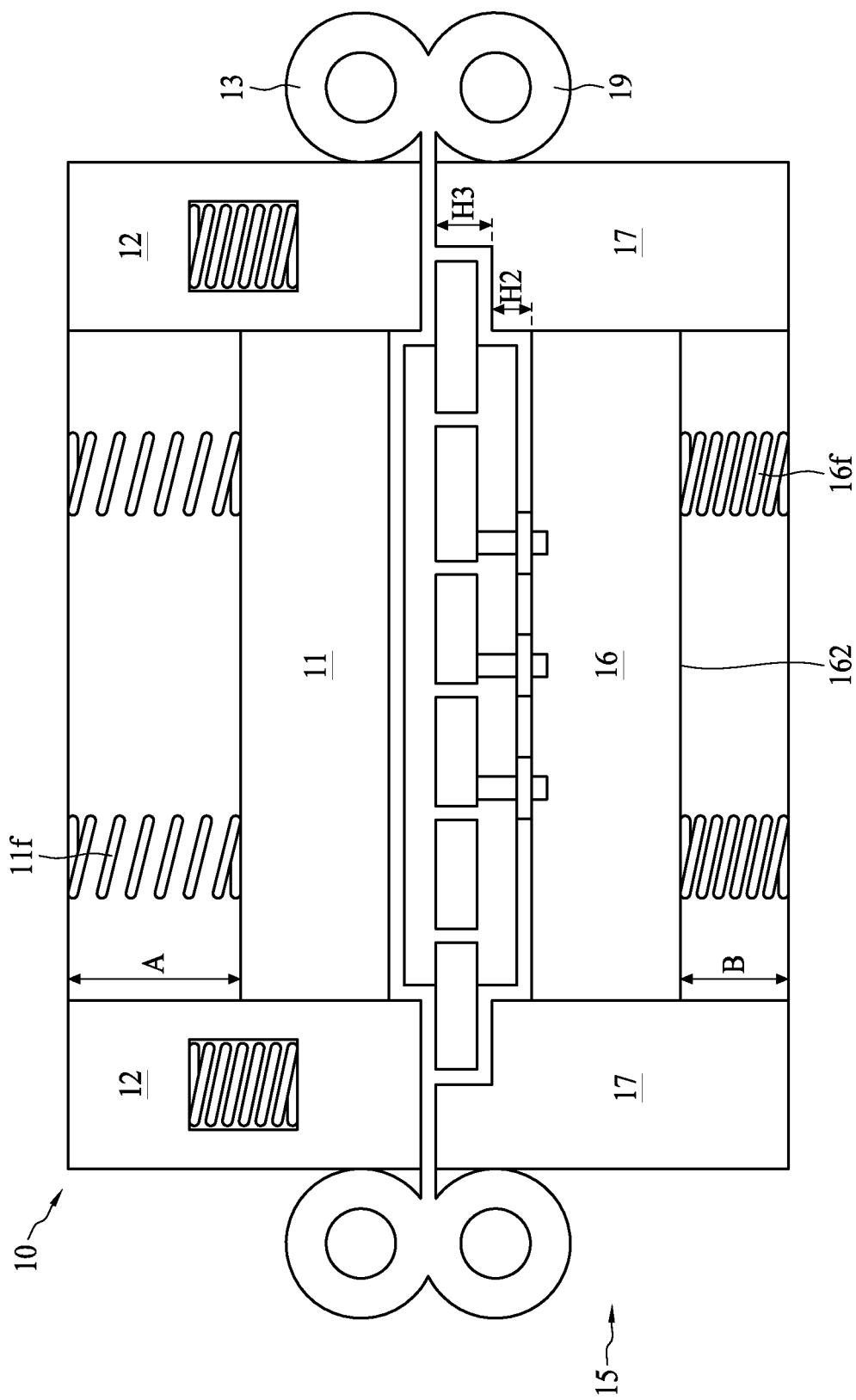

Referring to FIG. 4C, the upper mold 10 and the bottom mold 15 are moved to be close to each other so that a lateral portion of the object 40 is fixed in the stepped structure 17s and the molding material 41 is then uniformly formed or disposed on the top surface 401 and the bottom surface 402 of the object 40. In some embodiments, before moving the upper mold 10 and the bottom mold 15 to be close to each other, a top surface of the portion 18c of the support element 18 is lower than the first surface 17s1 of the frame 17 and supports the middle portion of the object 40 where a bending may occur. After the upper mold 10 and the bottom mold 15 are closed, the plate 16 moves toward the plate 11, so as to force the molding material 41 to flow to the top surface 401 of the object 40 through the openings 40h. In some embodiments, the plate 16 moves toward the plate 11 so that the top surface of the portion 18c of the support element 18 is substantially coplanar with the first surface 17s1 of the frame 17.

In some embodiments, the molding material 41 is in a liquid state before being introduced into the space defined by the surface 161 of the plate 16, the sidewalls 17s3, 17s4 of the stepped structure 17s of the frame 17 and the surfaces 17s1, 17s2 of the stepped structure 17s of the frame 17. In other embodiments, the molding material 41 is in a solid state (such as powder) before being introduced into the space defined by the surface 161 of the plate 16, the sidewalls 17s3, 17s4 of the stepped structure 17s of the frame 17 and the surfaces 17s1, 17s2 of the stepped structure 17s of the frame 17. After the upper mold 10 and the bottom mold 15 are closed, heat is applied to the molding material 41 to transform the molding material 41 from the solid state into the liquid state, so that the molding material 41 can flow to the top surface 401 and the bottom surface 402 of the object 40. After moving the plate 16 toward the plate 11, the molding material 41 is cured or hardened by providing heat to the molding material 41.

In some embodiments, the molding material 41 in the liquid state is applied to the top surface 401 of the object 40 rather than applied into the space defined by the surface 161 of the plate 16, the sidewalls 17s3, 17s4 of the stepped structure 17s of the frame 17 and the surfaces 17s1, 17s2 of the stepped structure 17s of the frame 17. The object 40 is then placed on the bottom mold 15 (e.g., on the support element 18 and the surface 17s1 of the stepped structure 17s of the frame 17), and the molding material 41 is introduced from the top surface 401 of the object 40 to the bottom surface 402 of the object 40 through the openings 40h.

Figure 4D:
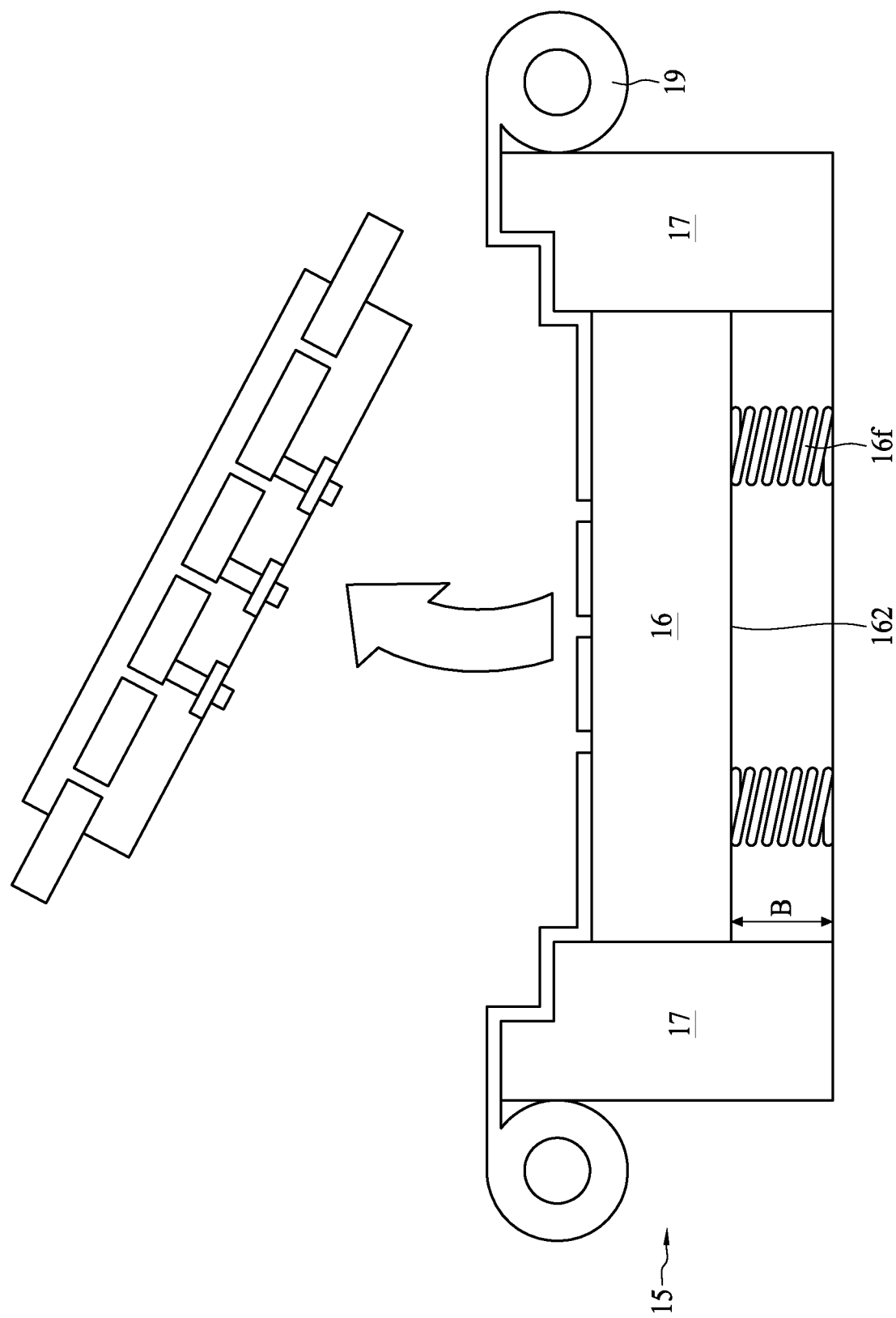

Referring to FIG. 4D, after the molding material 41 is hardened or cured, the object 40 and the molding material 41 are released together with the support element 18.

In accordance with some embodiments, both the top surface 401 and the bottom surface 402 of the object 40 can be molded at the same time. For example, both sides of the object 40 can be molded in a single molding process, which may reduce the manufacturing cost and time.

FIGS. 5A, 5B, 5C and 5D illustrate a method for double-side molding an object 50 in accordance with some embodiments of the present disclosure. The operations shown in FIGS. 5A-5D are similar to those shown in FIGS. 4A-4D, respectively, except that the object 50 to be molded is different from the object 40.

Figure 5A:
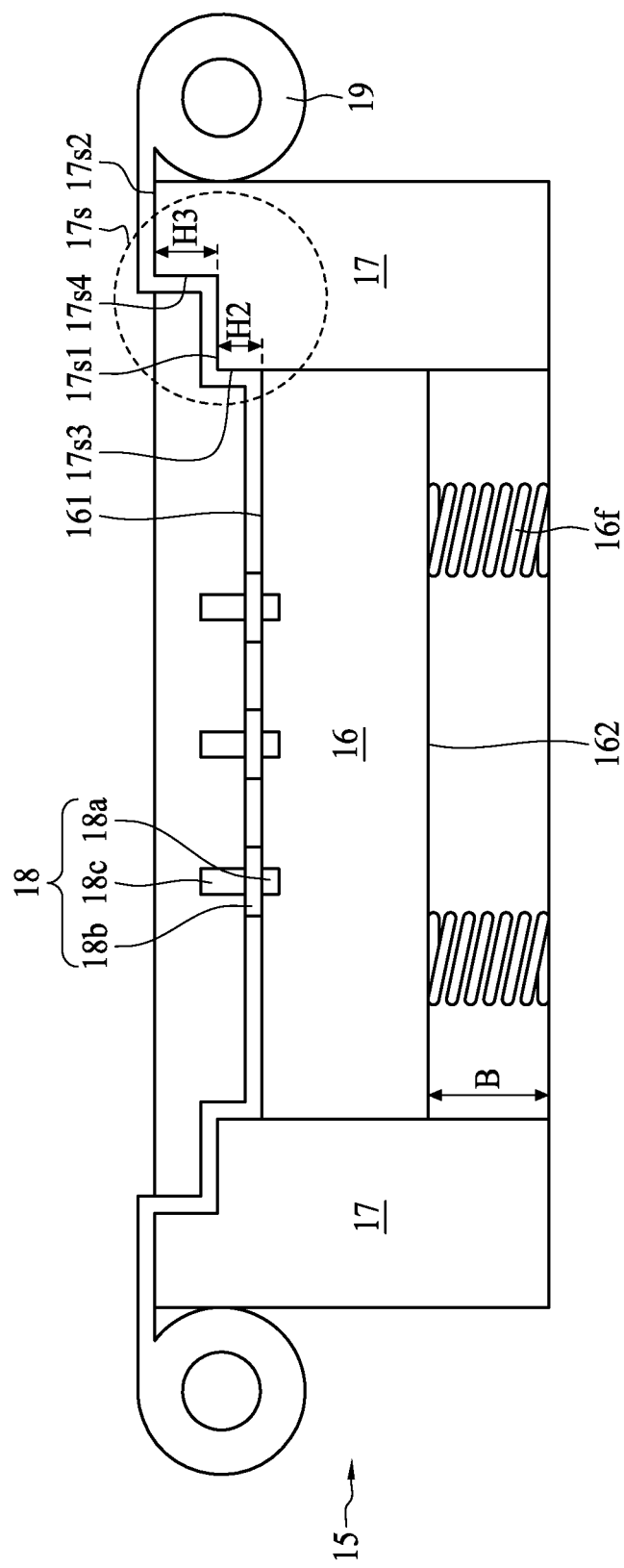
FIG. 5A, FIG. 5B, FIG. 5C and FIG. 5D illustrate a method for double-side molding in accordance with some embodiments of the present disclosure.
Figure 5B:
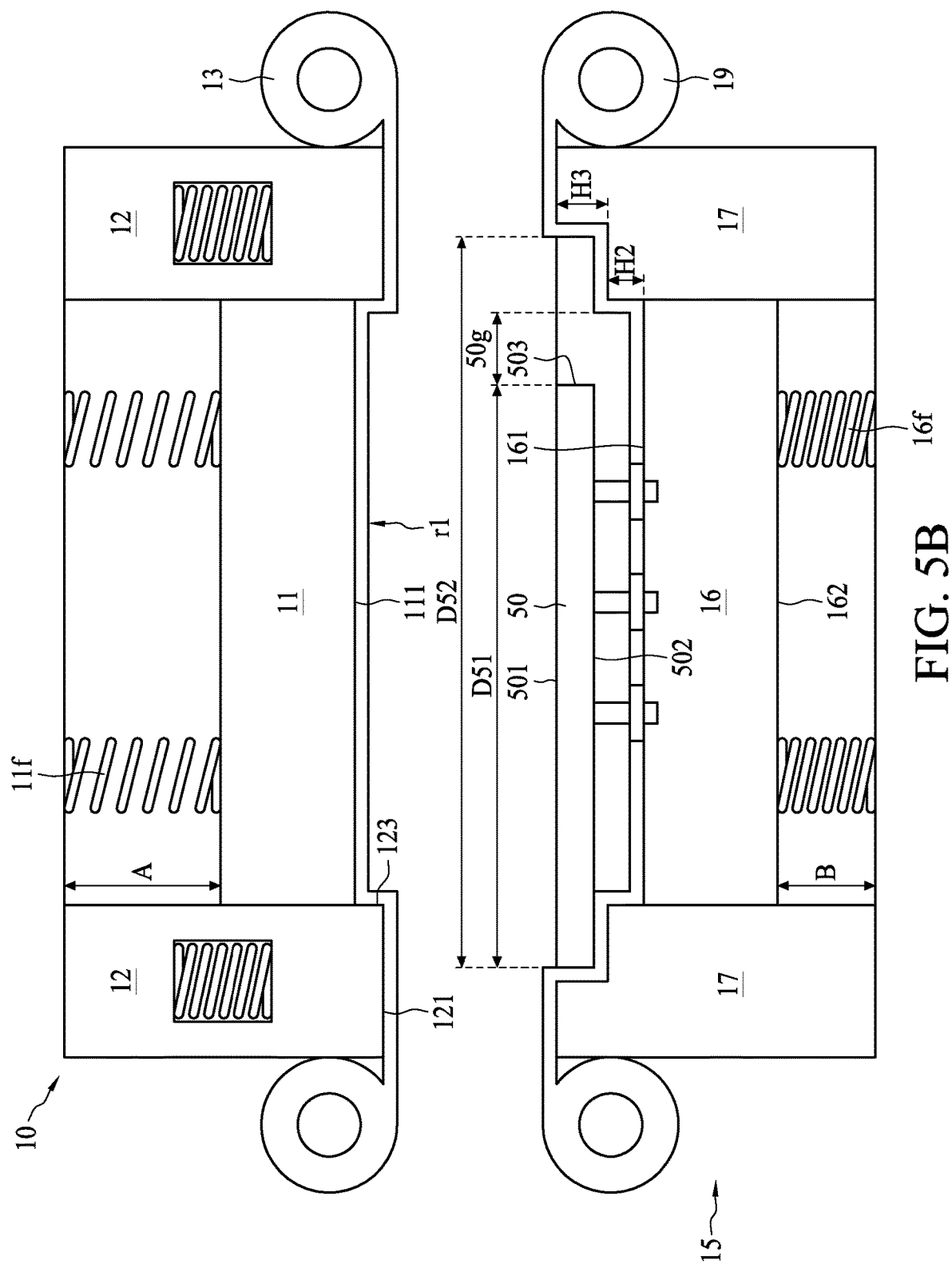

As shown in FIG. 5B, a width D51 of the object 50 is less than a distance D52 between sidewalls 17s4 of the stepped structure 17s of the frame 17. The object 50 is placed on the support element 18 and the surface 17s1 of the stepped structure 17s of a portion of the frame 17. In other words, a portion of the surface 17s1 of the frame 17 does not support the object 50. After the object 50 is placed, a gap 50g is formed between a lateral surface 503 of the object 50 and the sidewall 17s3 of the frame 17, and thus the molding material 41 flows from a bottom surface 502 of the object 50 to a top surface 501 of the object 50 through the gap 50g.

Figure 5C:
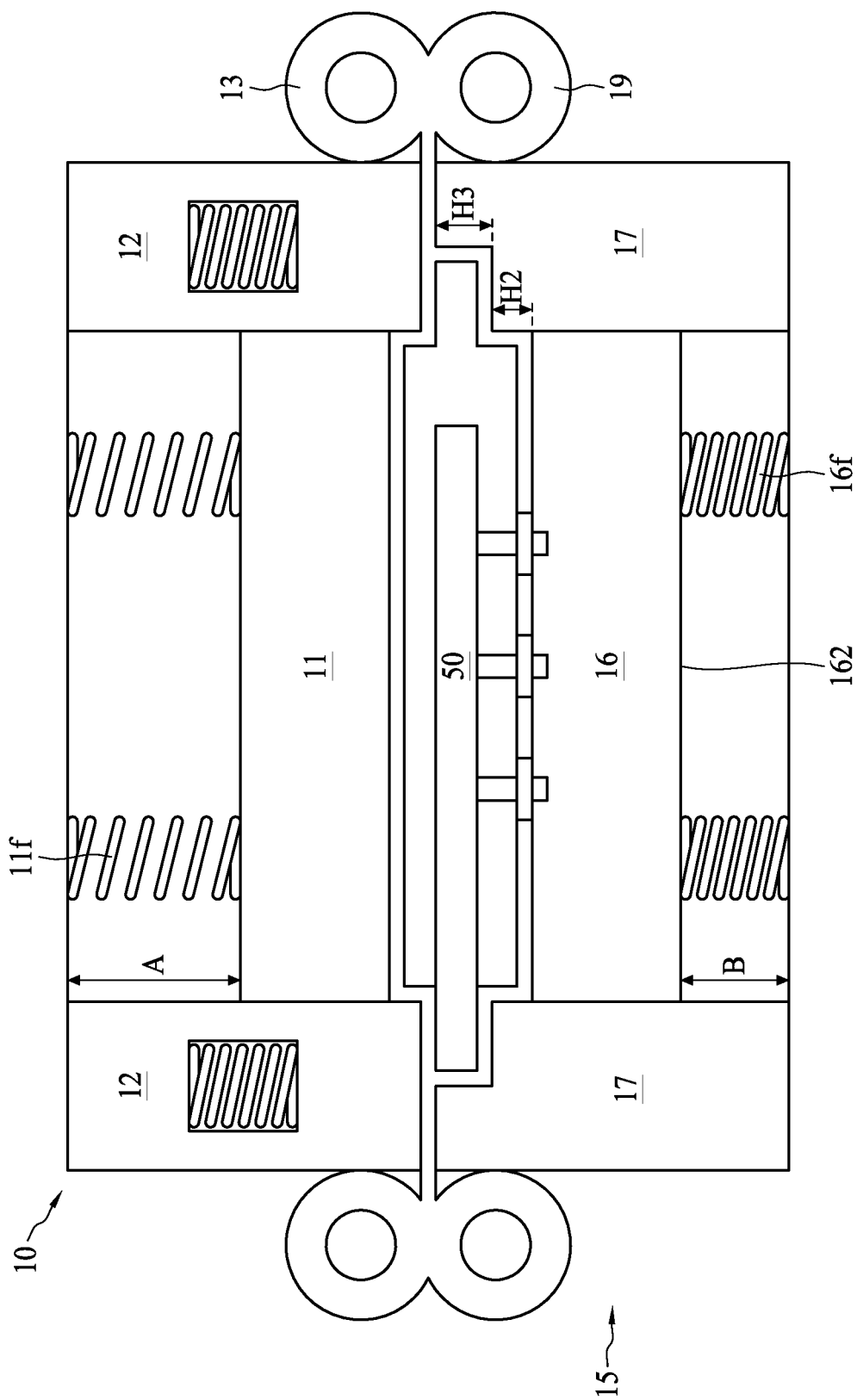

Referring to FIG. 5C, the upper mold 10 and the bottom mold 15 are moved to be close to each other and the molding material 41 is then uniformly formed or disposed on the top surface 501 and the bottom surface 502 of the object 50 simultaneously.

Figure 5D:
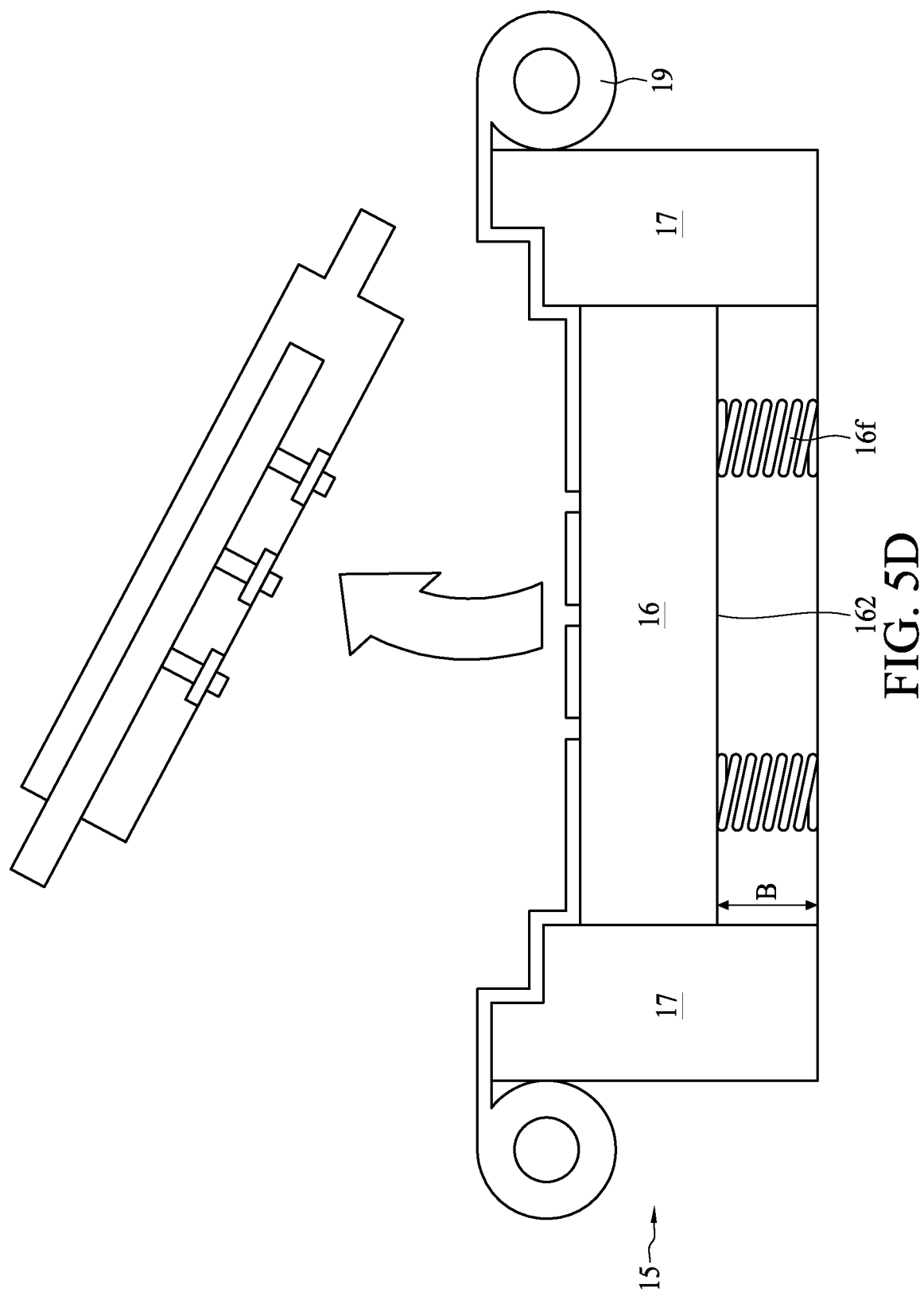

Referring to FIG. 5D, after the molding material 41 is hardened or cured, the object 50 and the molding material 51 are released together with the support element 18.

In accordance with some embodiments, both the top surface 501 and the bottom surface 502 of the object 50 can be molded at the same time. For example, both sides of the object 50 can be molded in a single molding process, which may reduce the manufacturing cost and time.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. Such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An apparatus for packaging a semiconductor device, comprising:
   a first mold including a plate;
   a second mold including a carrier disposed aligned with the plate, wherein the carrier comprises at least one hole penetrating the carrier;
   a support element partially disposed within the hole and protruding from a first surface of the carrier facing the plate of the first mold, the support element including a first portion within the hole, a second portion exposed from the carrier, and a third portion on the carrier and between the first portion and the second portion; and
   a release film disposed on a surface of the carrier facing the first mold, wherein a portion of the release film is disposed between the surface of the carrier and the support element, the first portion of the support element penetrates through the release film,
   wherein the support element is configured to support an object to be molded, and wherein the third portion is wider than the first portion and the second portion.

2. The apparatus of claim 1, wherein the first mold further includes a first frame surrounding the plate, and the plate is moveable relative to the first frame.

3. The apparatus of claim 1, wherein the second mold further includes a second frame surrounding the carrier, and the carrier is movable relative to the second frame.

4. The apparatus of claim 3, wherein the second frame and the carrier define a space to accommodate the support element and an object to be molded.

5. The apparatus of claim 3, wherein the second frame comprises a stepped structure for placing an object to be molded.

6. The apparatus of claim 1, wherein the hole is configured to transfer a suction force to the support element.

7. The apparatus of claim 1, wherein the plate is moveable toward the second mold.

8. The apparatus of claim 1, further comprising an elastic member connected to the plate and configured to control the movement of the plate.

9. The apparatus of claim 1, wherein the carrier is aligned with the plate.

10. The apparatus of claim 1, wherein the carrier is moveable toward the first mold.

11. The apparatus of claim 6, wherein the hole extends from the first surface of the carrier to a second surface of the carrier opposite to the first surface of the carrier.

12. The apparatus of claim 1, wherein the support element is disposed adjacent to an center of the carrier.

13. The apparatus of claim 2, wherein the plate is moveable along sidewall of the first frame.

14. The apparatus of claim 2, wherein the plate is moveable along sidewall of the first frame.

15. The apparatus of claim 4, wherein
   the second frame has a first surface and a second surface facing the first mold;

the first surface and the second surface of the second frame are discontinuously arranged; and the second surface of the second frame is configured to support an object to be molded.

16. The apparatus of claim 4, wherein a height of a portion of the support element exposed from the carrier is substantially the same as a distance between the second surface of the second frame and a top surface of the carrier.

17. The apparatus of claim 15, wherein a distance between the first surface of the second frame and the second surface of the second frame is substantially the same as a thickness of the object to be molded.

18. The apparatus of claim 11, further comprising an elastic member connected to the second surface of the carrier and configured to control the movement of the carrier.

19. The apparatus of claim 1, wherein the third portion of the support element is in contact with the release film.

20. The apparatus of claim 1, wherein the hole having a substantially uniform width.

* * * * *